US009369041B2

(12) United States Patent
Paduvalli et al.

(10) Patent No.: US 9,369,041 B2
(45) Date of Patent: Jun. 14, 2016

(54) ANALOG INPUT OUTPUT LINEARIZATION CONTROL

(71) Applicants: Cirasys, Inc., Dallas, TX (US); The Board of Regents, The University of Texas System, Austin, TX (US)

(72) Inventors: Vikas V. Paduvalli, Richardson, TX (US); Louis R. Hunt, Plano, TX (US); Poras T. Balsara, Plano, TX (US); Robert J. Taylor, Allen, TX (US)

(73) Assignees: Cirasys, Inc., Dallas, TX (US); The Board of Regents, The University of Texas System, Austin, TX (US)

(*) Notice: Subject to any disclaimer, the term of this patent is extended or adjusted under 35 U.S.C. 154(b) by 0 days.

(21) Appl. No.: 14/465,260

(22) Filed: Aug. 21, 2014

(65) Prior Publication Data

US 2014/0361754 A1    Dec. 11, 2014

Related U.S. Application Data

(63) Continuation-in-part of application No. 13/938,333, filed on Jul. 10, 2013, and a continuation-in-part of application No. 13/373,673, filed on Nov. 22, 2011, now Pat. No. 8,803,498, and a continuation-in-part of (Continued)

(51) Int. Cl.
*H02M 3/158* (2006.01)
*H02M 3/156* (2006.01)
*H03K 7/08* (2006.01)

(52) U.S. Cl.
CPC .............. *H02M 3/158* (2013.01); *H02M 3/156* (2013.01); *H03K 7/08* (2013.01)

(58) Field of Classification Search
CPC .............. H02M 3/156; H02M 1/4225; H02M 2001/007; H02M 3/158; H02M 2001/009; H02M 3/157; H02M 1/10; H03K 7/08; Y02B 70/126; H02P 27/047; H02P 4/00
See application file for complete search history.

(56) References Cited

U.S. PATENT DOCUMENTS 4,630,187 A    12/1986    Henze
4,677,366 A    6/1987    Wilkinson et al.

(Continued)

FOREIGN PATENT DOCUMENTS

WO    2010148066    12/2010
WO    2012091850    7/2012

OTHER PUBLICATIONS

Shortt, Daniel J., "An Improved Switching Converter Model," Ph.D. Dissertation, Virginia Polytechnic Institute and State University (1982).

(Continued)

*Primary Examiner* — Adolf Berhane
*Assistant Examiner* — Henry Lee, III
(74) *Attorney, Agent, or Firm* — Schultz & Associates, P.C.

(57) ABSTRACT

A voltage converter for converting an input voltage to an output voltage is disclosed. The voltage converter includes a voltage converter circuit having a set of switches, a switch driver connected to the voltage converter circuit, a controller connected to the switch driver and the output voltage, a target output voltage connected to the controller, a control signal generated by the controller for the switch driver that includes a duty ratio based on the target output voltage and the output voltage. The switch driver is configured to apply the control signal to the set of switches and the voltage converter circuit generates the output voltage based on the duty ratio to match the target output voltage.

22 Claims, 4 Drawing Sheets

Related U.S. Application Data application No. 12/487,242, filed on Jun. 18, 2009, now Pat. No. 8,810,221, and application No. 14/465,260, and a continuation-in-part of application No. 13/720,850, filed on Dec. 19, 2012.

(60) Provisional application No. 61/869,387, filed on Aug. 23, 2013, provisional application No. 61/670,520, filed on Jul. 11, 2012, provisional application No. 61/458,850, filed on Dec. 2, 2010, provisional application No. 61/578,137, filed on Dec. 20, 2011.

(56) References Cited

U.S. PATENT DOCUMENTS

| | | | |
|---|---|---|---|
| 4,929,882 | A | 5/1990 | Szepesi |
| 5,138,250 | A | 8/1992 | Capel |
| 5,311,421 | A | 5/1994 | Nomura et al. |
| 5,442,534 | A | 8/1995 | Cuk et al. |
| 5,477,132 | A | 12/1995 | Canter et al. |
| 5,708,433 | A | 1/1998 | Craven |
| 5,804,950 | A | 9/1998 | Hwang et al. |
| 5,886,586 | A | 3/1999 | Lai et al. |
| 5,920,471 | A | 7/1999 | Rajagopalan et al. |
| 5,943,224 | A | 8/1999 | Mao |
| 6,084,450 | A | 7/2000 | Smith et al. |
| 6,366,070 | B1 | 4/2002 | Cooke et al. |
| 6,407,515 | B1 | 6/2002 | Hesler et al. |
| 6,462,962 | B1 | 10/2002 | Cuk |
| 6,538,905 | B2 | 3/2003 | Greenfield et al. |
| 6,545,887 | B2 | 4/2003 | Smedley et al. |
| 6,674,272 | B2 | 1/2004 | Hwang |
| 6,956,360 | B2 | 10/2005 | Matsuura et al. |
| 7,103,425 | B1 | 9/2006 | Marra, III et al. |
| 7,239,257 | B1 | 7/2007 | Alexander et al. |
| 7,482,794 | B2 | 1/2009 | Hunt et al. |
| 7,489,186 | B2 | 2/2009 | Segarra |
| 7,602,166 | B1 | 10/2009 | Kang |
| 7,812,586 | B2 | 10/2010 | Soldano et al. |
| 7,851,941 | B2 | 12/2010 | Walley |
| 8,130,522 | B2 | 3/2012 | Maksimovic |
| 2001/0030879 | A1 | 10/2001 | Greenfield et al. |
| 2003/0090253 | A1 | 5/2003 | Balakrishnan |
| 2003/0199997 | A1 | 10/2003 | Gao |
| 2003/0222627 | A1 | 12/2003 | Hwang |
| 2006/0158910 | A1 | 7/2006 | Hunt et al. |
| 2007/0040536 | A1* | 2/2007 | Smith ............... H02M 3/157 323/280 |
| 2007/0046105 | A1 | 3/2007 | Johnson et al. |
| 2007/0236200 | A1 | 10/2007 | Canfield et al. |
| 2010/0141225 | A1 | 6/2010 | Isham et al. |
| 2010/0164282 | A1 | 7/2010 | Tseng et al. |
| 2010/0320978 | A1* | 12/2010 | Hunt ............... H02M 3/156 323/282 |
| 2012/0146596 | A1 | 6/2012 | Lin et al. |
| 2013/0301321 | A1 | 11/2013 | Hunt |

OTHER PUBLICATIONS

Sira-Ramirez, et al., "Exact Linearization in Switched Mode DC-to-DC Power Converters," Int. J. Control, 50 (1989), pp. 511-524.

Sira-Ramirez, "Switched Control of Bilinear Converters Via Pseudolinearization," IEEE Transactions on Circuits and Systems, vol. 36, No. 6, Jun. 1989, 8 pages.

Slotine, et al., "Applied Nonlinear Control," Prentice-Hall, Inc., Englewood Cliffs, 1991.

Su, R., "On the Linear Equivalents of Nonlinear Systems," Systems and Control Letters 2, (1982), 48-52.

Su, et al., "Linear Equivalents of Nonlinear Time-Varying Systems," International Symposium on Mathematical Theory of Networks and Systems (1981), 119-123.

Su, et al., "Robustness in Nonlinear Control," Differential Geometric Control Theory, Birkhauser, Boston, R. W. Brockett, R. S. Millman, and H. J. Sussman, Eds., (1983), 316-337.

Tang, Wei, "Average Current-Mode Control and Charge Control for PWM Converters," Ph. D. Dissertation, Virginia Polytechnic Institute and State University (1994).

Taylor, Robert J., "Feedback Linearization of Fixed Frequency PWM Converters," Revised Ph.D. Dissertation, University of Texas at Dallas, (undated), 174 pages.

Hunt, L.R., et al., "Global Transformations of Nonlinear Systems," IEEE Transactions on Automatic Control, vol. 28, No. 1, Jan. 1983, pp. 24-31.

Ma, D., et al., "Enabling Power-Efficient DVFS Operations in Silicon," IEEE Circuits and Systems Magazine, First Quarter, 2010, 14-30.

Meyer, G., et al., "Nonlinear System Guidance in the Presence of Transmission Zero Dynamics," NASA Technical Memorandum 4661, Jan. 1995.

Middlebrook, et al., "A General Unified Approach to Modeling Switching-Converter Power Stages," IEEE Power Electronics Specialists Conference Record, Jun. 1976, pp. 18-34.

Ridley, Ray, "11 Ways to Generate Multiple Outputs," Switching Power Magazine, 2005, 1-12.

Sable, et al., "Elimination of the Positive Zero in Fixed Frequency Boost and Flyback Converters," Proceedings of 5th IEEE Applied Power Electronics Conference, 1990, pp. 205-211.

Taylor, Robert J., "Feedback Linearization of Fixed Frequency PWM Converters," Ph.D. Dissertation, University of Texas at Dallas, published Nov. 2005, 174 pages.

Bodson, et al., "Differential-Geometric Methods for Control of Electric Motors," Int. J. of Robust and Nonlinear Control 8, (1998), pp. 923-954.

Ćuk, "Modelling, Analysis, and Design of Switching Converters," Dissertation, California Institute of Technology (1977), 317 pages.

Deisch, C.W., "Simple Switching Control Method Changes Power Converter into a Current Source," IEEE Power Electronics Specialists Conference, 1978 Record, pp. 300-306.

Hunt, et al., "Design for Multi-Input Nonlinear Systems," Differential Geometric Control Theory, Birkhauser, Boston, R. W. Brockett, R. S. Millman, and H. J. Sussman, Eds., (1983), 268-298.

Isidori, A. "Nonlinear Control Systems," 3rd Ed, Springer-Verlag London Limited (1995).

Meyer, et al., "Applications of Nonlinear Transformations to Automatic Flight Control," Automatica, 20 (1984), 103-107.

Mitchell, D. M., "DC-DC Switching Regulator Analysis, Reprint Edition," D.M. Mitchell Consultants, McGraw-Hill, Inc. (1988).

Ridley, "A New Small-Signal Model for Current-Mode Control," Ph. D. Dissertation, Virginia Polytechnic Institute and State University (1990) 15 pages.

Sanders, "Nonlinear Control of Switching Power Converters," Ph.D. Dissertation, Massachusetts Institute of Technology (1989) 254 pages.

\* cited by examiner

ANALOG INPUT OUTPUT LINEARIZATION CONTROL

CROSS REFERENCE TO RELATED APPLICATIONS

This application claims priority to U.S. Provisional Application No. 61/869,387 filed Aug. 23, 2013. This application is a continuation in part of U.S. application Ser. No. 13/938,333 filed Jul. 10, 2013, which claims priority to U.S. Provisional Application No. 61/670,520 filed Jul. 11, 2012 and is a continuation in part of U.S. application Ser. No. 13/373,673 filed Nov. 22, 2011, now U.S. Pat. No. 8,803,498, which claims priority to U.S. Provisional Application No. 61/458,850 filed Dec. 2, 2010 and is a continuation in part of U.S. application Ser. No. 12/487,242 filed Jun. 18, 2009, now U.S. Pat. No. 8,810,221. This application is a continuation in part of U.S. application Ser. No. 13/720,850 filed Dec. 19, 2012, which claims priority to U.S. Provisional Application No. 61/578,137 filed Dec. 20, 2011. Each of the patent applications identified above is incorporated herein by reference in its entirety to provide continuity of disclosure.

FIELD OF THE INVENTION

The present invention relates generally to providing modulation signals to electrical circuits and, more particularly, to providing analog and or digital control for voltage converters based on input-output linearization.

BACKGROUND OF THE INVENTION

Power converters are used to convert one form of energy to another (e.g., AC to AC, AC to DC, DC to AC, and DC to DC) thereby making it usable to the end equipment, such as computers, automobiles, electronics, telecommunications, space systems and satellites, and motors. Every application of power electronics involves some aspect of control. Converters are typically identified by their capability and/or configurations, such as, buck converters, boost converters, buck-boost converters, boost-buck converters (auk), etc. These converters can belong to a family of converters known as "switching regulators" (DC-DC conversion), "switching converters", or "switching inverters" (DC-AC conversion) depending upon their configuration. Switching converters are generally efficient because the conversion elements switch from one state to another, rather than needlessly dissipating power during the conversion process. Essentially there is a converter circuit including a set of switches and at least two configurations of the converter, according to the states of the set of switches. Each configuration can be modeled as a linear system. The duty ratio (d) is the ratio indicating the time while one switch is in the "on" position and another switch is in the "off" position: this d is considered to be the control input. Control input d is usually driven by pulse-width-modulation ("PWM") techniques.

Switching from one state to another during operation and the accompanying nonlinearity of power converters creates problems. State space averaging reduces the transient problems to make the system, in general, a nonlinear averaged system for a boost converter or a buck-boost converter. But, control of the system under these nonlinear effects becomes difficult when certain performance objectives must be met. Linearization is mostly accomplished through a Taylor series expansion. Nonlinear terms of higher orders are thrown away and a linear approximation replaces the nonlinear system. This linearization method has proven effective for stabilizing control loops at a specific operating point. However, use of this method requires making several assumptions, one of them being so-called "small signal operation." This works well for asymptotic stability in the neighborhood of the operating point, but ignores large signal effects which can result in nonlinear operation of the control loop when, for example, an amplifier saturates during startup, or during transient modes, such as load or input voltage changes. Once nonlinear operation sets in, the control loop can have equilibrium points unaccounted for in the linearization.

One of the most widely used methods of pulse-width modulation is trailing-edge modulation ("TEM"), wherein the on-time pulse begins on the clock and terminates in accordance with a control law. Unstable zero dynamics associated with TEM with switch on-time sampling in the continuous conduction mode ("CCM") prevent the use of an input-output feedback linearization because it would result in an unstable operating point for boost and buck-boost converters. The other modulation method is leading-edge modulation ("LEM"), wherein the on-time pulse begins in accordance with a control law and terminates on the clock. The difference between LEM and TEM is that in TEM the pulse-width is determined by the instantaneous control voltage $v_c$ prior to switch turn-off, whereas in LEM the pulse-width is determined by $v_c$ prior to switch turn-on.

Further, it is known in the art that pulse-width modulation ("PWM") of boost and buck-boost power converters exhibit right half plane zero effects when trailing edge modulation with on time switch sampling is employed. This makes control design extremely difficult. It has been shown that if leading edge modulation or trailing edge modulation with off time switch sampling is used with a sufficiently large equivalent series resistance ("ESR") $R_c$ of the output capacitor, then left half plane zero effects emerge.

Therefore, there is a need for a simple and robust control system and method for converters with off-time sampling and either LEM or TEM control.

SUMMARY

In a preferred embodiment, a voltage converter for converting an input voltage to an output voltage is disclosed. The voltage converter includes a voltage converter circuit having a set of switches, a switch driver connected to the voltage converter circuit, a controller connected to the switch driver and the output voltage, a target output voltage connected to the controller, a control signal generated by the controller for the switch driver that includes a duty ratio based on the target output voltage and the output voltage. The switch driver is configured to apply the control signal to the set of switches and the voltage converter circuit generates the output voltage based on the duty ratio to match the target output voltage.

In a preferred embodiment, the controller utilizes input-output linearization that only senses the output voltage and the target output voltage. In one embodiment, the controller is configured to receive time-varying input and output voltages.

In one embodiment, the target output voltage is a known function of time. In another embodiment, the target output voltage is an arbitrary voltage.

In one embodiment, the voltage converter circuit is a buck converter. In another embodiment, the voltage converter circuit is a boost converter. In another embodiment, the voltage converter circuit is a buck-boost converter. In other embodiments, any converter circuit topology is employed.

BRIEF DESCRIPTION OF THE DRAWINGS

In the detailed description presented below, reference is made to the accompanying drawings.

DETAILED DESCRIPTION

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use the invention and do not delimit the scope of the invention.

The present disclosure provides a method and apparatus for controlling a voltage converter circuit to realize a power converter or a power inverter. A power converter usually refers to a device that delivers a regulated output voltage in response to an unregulated input voltage. A power inverter in power electronics usually refers to a power converter device that delivers an ac output voltage in response to a dc input voltage although an arbitrary time-varying output waveform for one of either a dc voltage input or an ac voltage input is possible. In particular, the present disclosure uses input-output linearization to compute a duty ratio for control feedback of a voltage converter. Embodiments for a buck converter, a boost converter and a buck-boost converter are disclosed, where the boost and buck-boost converters use off-time sampling with either leading edge modulation or trailing edge modulation. The resulting control system can also be applied to other converter types. Moreover, the parameters in the control system are programmable, and hence the algorithm can be easily implemented on a DSP or in silicon, such as an Application Specific Integrated Circuit ("ASIC").

In general, buck, boost, and buck-boost converter circuits are characterized by state equations for state variables $x_1$ (inductor current), $x_2$ (capacitor voltage) and y (output voltage). A control signal is applied to a primary switch ($S_1$) characterized by its instantaneous duty ratio d. For DC-DC converters, the steady-state output voltage of a boost voltage converter is $1/(1-D)$ times the input voltage where D is the steady-state value of the instantaneous duty ratio d. The steady-state output voltage of a buck-boost converter is $D/(1-D)$ times the input voltage and the steady-state output voltage of a buck converter is D times the input voltage. For a voltage converter with time-varying output voltage, y(t) and the resultant duty ratio d(t) also varies with time.

Figure 1:
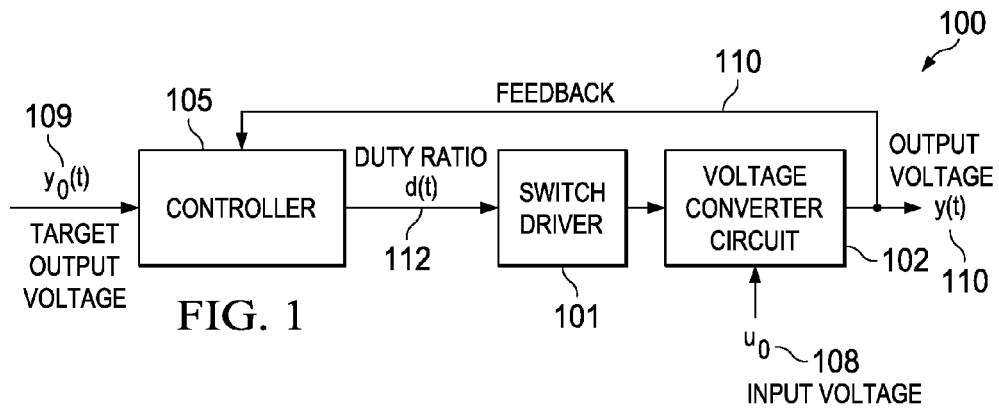
FIG. 1 is a block diagram of a preferred embodiment of a voltage converter including a voltage converter circuit, a switch driver and a controller.

FIG. 1 shows a preferred embodiment of a converter 100 suitable for controlling a voltage converter circuit to produce an output voltage. Converter 100 is amenable to input-output linearization methods that do not constrain stability to one operating point, but rather to a set of operating points spanning the expected range of operation during startup and transient modes of operation. A voltage converter circuit 102 is connected to an input voltage 108 ($u_0$) and a switch driver 101. A controller 105 is connected to switch driver 101 and sends the switch driver a control signal 112 which defines a duty ratio d(t) for one or more switches. Switch driver 101 operates a set of switches in voltage converter circuit 102 in response to control signal 112. Voltage converter circuit 102 produces an output voltage 110, y(t), based on the duty ratio. Output voltage 110 is also fed back to controller 105. Output voltage 110 is intended to match target output voltage 109, $y_0(t)$.

In a preferred analog embodiment, disclosed further below, controller 105 produces control signal 112 from sensing output voltage 110 and target output voltage 109.

In a digital embodiment, for example as described in the related U.S. patent application Ser. No. 13/938,333 ('333 patent application), the controller produces the control signal from sensing the output voltage, the input voltage, the target output voltage, a set of static circuit parameters including, for example, the load resistance R, the capacitance C and the inductance L, and a set of state variables including, for example, inductor current $x_1$ and capacitor voltage $x_2$. Control signal 112 determines the states of a set of switches internal to voltage converter circuit 102.

In one embodiment, the input voltage, the target output voltage, and the output voltages are fixed voltages. In other embodiments, the input voltage, the target output voltage, and the output voltages are time-varying voltages.

Examples of voltage converter circuit 102 include a buck converter, a boost converter and a buck-boost converter and any of their derived topologies, whether or not synchronous rectification is included. For example, buck-derived topologies such as Forward, Half-Bridge, Full-Bridge, and Push-Pull may be employed. Buck-boost derived topologies include Flyback. Boost-derived topologies such as Isolated Boost may be employed. Any suitable topology known in the art may be employed.

Generally, voltage converters operating in the continuous conduction mode with trailing edge modulation (TEM) and switch on-time sampling give rise to unstable zero dynamics for boost and buck-boost converters where the linear segment of the system about an operating point has a right half plane zero. In a preferred control embodiment, leading-edge modulation (LEM) with switch-off time sampling is implemented by controller 105 that changes the zero dynamics under the appropriate Ridley condition for the boost converter and the appropriate Ridley condition for the buck-boost converter, so that the linear part of the system has only left half plane zeros. In an alternate embodiment, trailing-edge modulation (TEM) with switch-off time sampling is implemented. Since the resulting nonlinear system possesses stable zero dynamics, input-output feedback linearization is employed wherein a linearizing transformation is performed and used to define the control signal for the switch driver and converter. The control signal duty ratio and resulting zero dynamics for boost and buck-boost converters are the same for both LEM and TEM with switch off-time sampling.

A buck converter is a linear system which has a left half plane zero in its transfer function; therefore, input-output linearization can always be employed, regardless of the modulation method and switch time sampling method used.

An inverter in power electronics usually refers to a power converter device delivering a sinusoidal AC output voltage in response to a DC input voltage. In the embodiments disclosed below, voltage converters may have output voltages with bounded time functions, not just dc or sinusoidal waveforms, as the desired output voltages. These converters will be known as tracking inverters. The tracking inverter supports a steady state tracking inversion, which is the process of establishing a control signal d(t) so that the output voltage y(t) converges to the desired output voltage $y_0(t)$ as time, t, goes to infinity Voltage converters and tracking inverters, based on buck, boost and buck-boost converters are analyzed using their respective Cuk-Middlebrook two dimensional state space averaged models.

A general theory of steady state conversion for time-varying inputs and outputs is disclosed for tracking inverters in the '333 patent application.

Buck Converter

Figure 2:
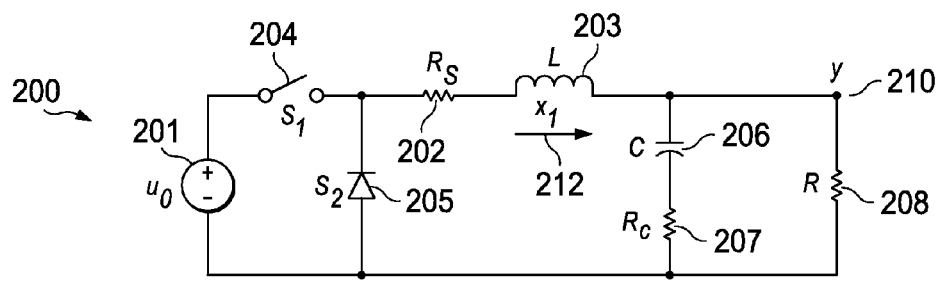
FIG. 2 is a circuit diagram of a buck converter of a preferred embodiment.

FIG. 2 illustrates a preferred embodiment of a buck converter circuit 200 having a single output voltage 210 (y). The buck converter circuit 200 includes a switch 204 ($S_1$) connected in series with a series resistor 202 ($R_S$) connected to inductor 203 (L) which is further connected to load resistance 208 (R). Switch 204 ($S_1$) further connects to DC voltage input 201 ($u_0$) to complete a series circuit. A switch 205 ($S_2$) is connected between switch 204 and series resistor 202 ($R_S$). Switch 205 ($S_2$) is further connected to the common of voltage input 201 ($u_0$–). A capacitive circuit is connected in parallel with load resistance 208 and includes a capacitor 206 (C) connected to a DC series resistance 207 ($R_C$) associated with capacitor 206. The output voltage 210 is taken across load resistance 208, is non-negative and is less than DC voltage input 201. The inductor current 212 ($x_1$) is measured as the current through inductor 203 and series resistor 202.

In an embodiment of a buck converter, buck converter circuit 200 is substituted for voltage converter circuit 102 where the DC voltage input $u_0$ is a constant and the target output voltage $y_0$ is a constant. The state equations for y and $x_1$ for the buck converter under nonlinear Cuk-Middlebrook averaging with LEM and switch-off time sampling are:

$$\dot{y} = \frac{R_c R}{R + R_c}\left[-\left(\frac{1}{L} + \frac{1}{RR_c C}\right)y + \left(-\frac{R_s}{L} + \frac{1}{R_c C}\right)x_1 + \frac{u_0}{L}d\right] \quad \text{Eq. 1}$$

$$\dot{x}_1 = -\frac{1}{L}y - \frac{R_s}{L}x_1 + \frac{u_0}{L}d$$

$$y = y$$

The zero of the transfer function for these state equations is $$-\frac{1}{R_c C},$$

which is in the open left half plane. Implementing a proportional output feedback in the controller with proportional gain k, the duty ratio for the feedback control signal supplied to the buck converter circuit by the controller is found by setting $\dot{y}=\dot{y}_0-k(y-y_0)$ and solving for d. For constant $y_0$, this results in the formula:

$$d = \frac{(RR_c C + L)y - (-RR_s R_c + LR)x_1 + (R+R_c)LCk(y_0 - y)}{RR_c C u_0} \quad \text{Eq. 2}$$

When controller 105 implements Eq. 2, the output voltage y converges asymptotically to $y_0$, the duty ratio d converges asymptotically to a steady-state value D as t goes to infinity and steady-state tracking is achieved for the buck converter. For the transfer function of the linear system Eq. 1 representing the buck converter, controller 105 implementing Eq. 2 cancels the open left half plane zero with a pole and places the other pole at –k.

In another embodiment, integral and derivative gain can also be used to derive and implement the duty ratio d.

In a more general embodiment of a buck converter, the target output voltage is not constant, but is a time-varying function $y_0(t)$ which together with its time derivative, are general functions that are bounded on [0, ∞). A time-varying target output voltage is handled by controller 105 by utilizing the target output voltage and its derivative, $y_0(t)$ and $\dot{y}_0(t)$, to compute d(t) as given in the '333 patent application and applying the feedback control signal with d (t) to the voltage converter circuit.

Boost Converter

Figure 3:
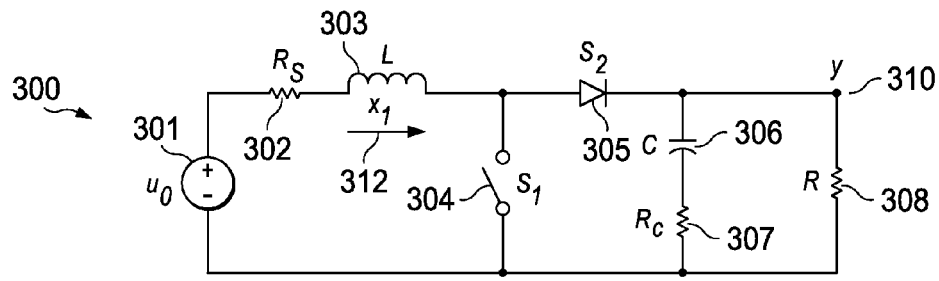
FIG. 3 is a circuit diagram of a boost converter of a preferred embodiment.

FIG. 3 illustrates a preferred embodiment of a boost converter circuit 300 having a single output voltage 310 (y). The boost converter includes a series resistor 302($R_S$) connected in series with an inductor 303 (L), a switch 304 ($S_1$), and a DC voltage input 301 ($u_0$). A capacitive circuit includes a switch 305 ($S_2$), connected in series to inductor 303, further connected in series to a capacitor 306 (C) and DC series resistance 307 ($R_C$) associated with capacitor 306. Load resistance 308 (R) is connected in parallel with capacitor 306 and DC series resistance 307. Output voltage 310 is taken across load resistance 308. The inductor current 312 ($x_1$) is measured as the current through inductor 303 and series resistor 302.

In an embodiment of a boost converter, boost converter circuit 300 is substituted for voltage converter circuit 102, and controller 105 is based on LEM with switch off time sampling of the state variables, the DC voltage input $u_0$ is a constant and the target output voltage $y_0$ is constant. The state equations for y and $x_1$ for the boost converter under nonlinear Cuk-Middlebrook averaging with LEM and switch-off time sampling are:

$$\dot{y} = \frac{1}{(R+R_C)LC}\left[-(RR_C C + L)y + (L - R_S R_C C)Rx_1 + RR_C C u_0 + R\left(R_C C y - \frac{LR}{(R+R_C)}x_1\right)d\right] \quad \text{Eq. 3}$$

$$\dot{x}_1 = -\frac{1}{L}y - \frac{R_s}{L}x_1 + \frac{u_0}{L} + \frac{y}{L}d$$

$$y = y$$

Linearization about an equilibrium point results in a zero of the transfer function of Eq. 3 in the open left half plane if the Ridley condition $$R_C C > \frac{L}{R(1-D)} \quad \text{Eq. 4}$$

is met, where D is a duty ratio for the instantaneous equilibrium point ($y=y_0$ and $x_1=x_{10}$) where $y_0$ and $x_{10}$ are constants. If the Ridley condition is not met, then the delta-E method as described in related U.S. patent application Ser. No. 13/720,850 ('850 patent application) for a boost converter is employed. Other methods for having the zero dynamics in the transfer function in the open left half plane known in the art may be employed.

Implementing a proportional output feedback in the controller with proportional gain k, the duty ratio for the feedback control signal supplied to the boost converter circuit by the controller is found by setting $\dot{y}=\dot{y}_0-k(y-y_0)$ and solving for d. For constant $y_0$, this results in the formula:

$$d = \frac{(R+R_C)LCk(y_0-y)+(RR_CC+L)y-(L-R_SR_CC)Rx_1-RR_CCu_0}{R\left(R_CCy-\frac{LR}{(R+R_C)}x_1\right)} \quad \text{Eq. 5}$$

When controller 105 implements Eq. 5, y(t) converges asymptotically to $y_0$, the duty ratio d converges asymptotically to a steady-state value D as t goes to infinity and steady-state tracking is achieved for the boost converter. For the transfer function of the linear system Eq. 3 representing the boost converter, controller 105 implementing Eq. 5 cancels the open left half plane zero with a pole and places the other pole at –k.

In another embodiment, integral and derivative gain can also be used to derive and implement the duty ratio d.

In a more general embodiment of a boost converter, the target output voltage is not constant, but is a time-varying function $y_0(t)$ which together with its time derivative, are general functions that are bounded on $[0, \infty)$. A time-varying target output voltage is handled by controller 105 by utilizing the target output voltage and its derivative, $y_0(t)$ and $\dot{y}_0(t)$, to compute d(t) as given in the '333 patent application and applying the feedback control signal with d(t) to the voltage converter circuit.

Buck-Boost Converter

Figure 4:
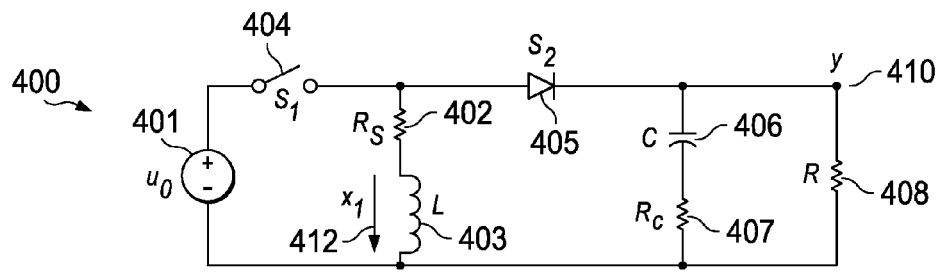
FIG. 4 is a circuit diagram of a buck-boost converter of a preferred embodiment.

FIG. 4 illustrates a preferred embodiment of a buck-boost converter circuit 400 having a single output voltage 410 (y). The buck-boost converter circuit 400 includes a switch 404 ($S_1$) connected in series with series resistor 402 ($R_S$) which is further connected to an inductor 403 (L). Inductor 403 and switch 404 are connected to DC voltage input 401 ($u_0$) to complete a series circuit. A capacitive circuit includes a switch 405 ($S_2$) connected between switch 404 and a capacitor 406 (C), and further connected in series with DC series resistance 407 ($R_C$) associated with capacitor 406. Load resistance 408 (R) is connected in parallel with the capacitor 406 and DC series resistance 407. Output voltage 410 is taken across load resistance 408. The inductor current 412 ($x_1$) is measured as the current through inductor 403 and series resistor 402.

In an embodiment of a buck-boost converter, buck-boost converter circuit 400 is substituted for voltage converter circuit 102, and controller 120 is based on LEM with switch off time sampling of the state variables, the DC voltage input $u_0$ is a constant and the target output voltage $y_0$ is a constant. The state equations for y and $x_1$ for the buck-boost converter under nonlinear Cuk-Middlebrook averaging with LEM and switch-off time sampling are:

$$\dot{y} = \frac{1}{(R+R_C)LC}\left[-(RR_CC+L)y+(L-R_SR_CC)Rx_1 + \right. \quad \text{Eq. 6}$$
$$\left. RR_CCu_0 + R\left(R_CCy - \frac{LR}{(R+R_C)}x_1 - R_CCu_0\right)d\right]$$

$$\dot{x}_1 = -\frac{1}{L}y - \frac{R_S}{L}x_1 + \frac{u_0}{L}d - \frac{y}{L}d$$

$$y = y$$

Linearization about an equilibrium point results in a zero of the transfer function of Eq. 6 in the open left half plane, if the Ridley condition $$R_CC > \frac{LD}{R(1-D)} \quad \text{Eq. 7}$$

is met where D is a duty ratio for the instantaneous equilibrium point ($y=y_0$ and $x_1=x_{10}$) where $y_0$ and $x_{10}$ are constants. If the Ridley condition is not met, then the delta-E method as described in related U.S. patent application Ser. No. 13/720,850 ('850 patent application) for a buck-boost converter is employed. Other methods for having the zero dynamics in the transfer function in the open left half plane known in the art may be employed.

Implementing a proportional output feedback in the controller with proportional gain k, the duty ratio for the feedback control signal supplied to the buck-boost converter circuit by the controller is found by setting $\dot{y}=\dot{y}_0-k(y-y_0)$ and solving for d. For constant $y_0$, this results in the formula:

$$d = \frac{(R+R_C)LCk(y_0-y)+(RR_CC+L)y+(L-R_SR_CC)Rx_1}{R\left(R_CCy+\frac{LR}{(R+R_C)}x_1-R_CCu_0\right)} \quad \text{Eq. 8}$$

When the controller implements Eq. 8, the output voltage converges asymptotically to $y_0$, the duty ratio d converges asymptotically to a steady-state value D as t goes to infinity and steady-state tracking is achieved for the buck-boost converter. For the transfer function of the linear system Eq. 6 representing the buck-boost converter, the controller implementing Eq. 8 cancels the open left half plane zero with a pole and places the other pole at –k.

In another embodiment, integral and derivative gain is used to derive and implement the duty ratio.

In a more general embodiment, the target output voltage is not constant, but is a time-varying function $y_0(t)$ which together with its time derivative, are general functions that are bounded on $[0, \infty)$. A time-varying target output voltage is handled by the controller by utilizing the target output voltage and its derivative, $y_0(t)$ and $\dot{y}_0(t)$, to compute d(t) as given in the '333 patent application and applying the feedback control signal with d(t) to the voltage converter circuit.

For time-varying inputs voltage $u_0(t)$, if the input $u_0(t)$ for the buck inverter is a bounded function of time, then the zero of the transfer function remains $-1/(R_CC)$, which is in the open left half plane.

For the boost and the buck-boost, a time-varying input voltage $u_0(t)$ appears to call for time-varying Ridley conditions. Suppose the Ridley condition for the boost converter and the Ridley condition for the buck-boost converter hold for every input voltage $u_0(t)$ for every t, then the general analysis, applied to the buck converter, is applied to the boost and buck-boost converter. In both the Eq. 5 for the boost and Eq. 8 for the buck-boost, a time-varying input voltage $u_0(t)$ is used.

Generally, time-varying voltages are easily handled by simply allowing $u_0$, $y_0$, and $\dot{y}_0$ to change with time. If $u_0(t)$ is a sinusoidal wave of a certain frequency and $y_0(t)$ is a sinusoidal wave of an arbitrary and different frequency, then a buck AC-AC converter is realized with any desired output frequency. This enables an inverter to operate a variable speed single phase motor drive from a standard ac source.

Analog Controller

Figure 5A:
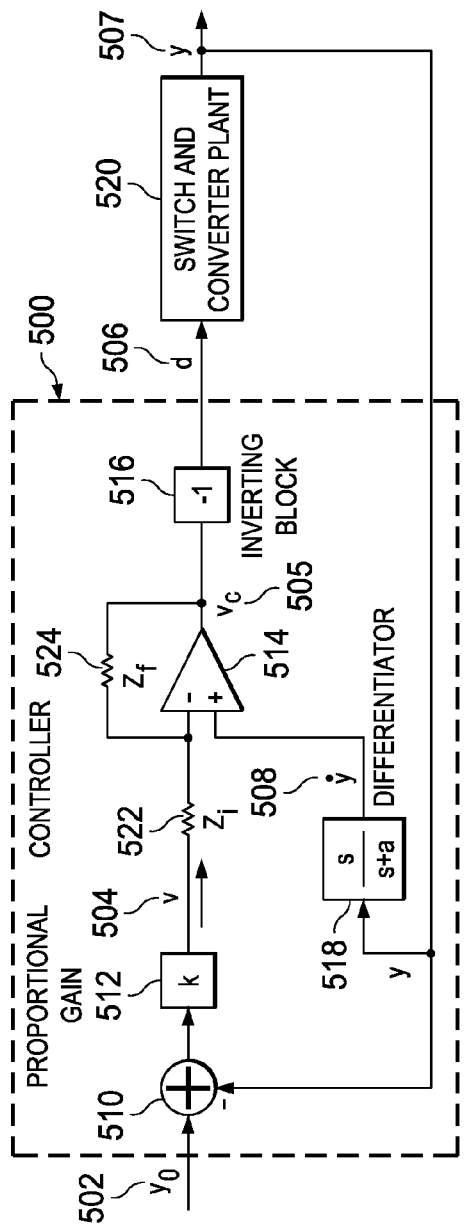
FIG. 5A is a circuit diagram of a preferred embodiment of an analog controller for a constant voltage converter plant implementing control under input-output linearization.

Referring to FIG. 5A, an analog controller suitable for controlling a voltage converter under input-output linearization conditions with off-time switching is disclosed. Analog controller 500 includes a summing block 510 connected to a proportional gain block 512 which is further connected through input impedance 522 ($Z_i$) to the negative input of an operational amplifier 514 in an inverting configuration. Operational amplifier 514 is operating in negative feedback with feedback impedance 524 ($Z_f$). In other embodiments, proportional gain block 512 is replaced by an integral gain block or a PI (proportional-integral) gain block or a PID (proportional-integral-derivative) gain block.

Amplifier output voltage 505 ($V_c$) is further connected to an inverting block 516 which produces a control signal 506 (d). The positive input of operational amplifier 514 is connected to the output of a differentiator 518 which differentiates the output voltage 507 (y) of a switch driver and voltage converter plant 520 to form differentiated output voltage 508 ($\dot{y}$). Control signal 506 is fed into switch driver and voltage converter plant 520 to control switching of an internal voltage converter.

Summing block 510, differentiator 518, and inverting block 516 are implemented using operational amplifiers as known in the art.

In another embodiment, producing the same result, the inverting block 516 is removed and the connections to the positive and negative inputs of operational amplifier 514 are reversed.

Summing block 510 is configured to generate a difference between the output voltage 507 and the target voltage 502 ($y_0$). Proportional gain block 512, applies proportional gain k to the difference, producing a voltage signal 504 given by $v=-k(y-y_0)$ where y is the output voltage and $y_0$ is the target voltage.

The differentiator 518 incorporates a capacitance that adds a pole to the differentiator transfer function at s=−a where s is the complex variable in the Laplace transform domain.

The amplifier output voltage 505 of inverting operational amplifier 514 is given by $$v_c = -\frac{Z_f}{Z_i}v + \left(1 + \frac{Z_f}{Z_i}\right)\dot{y}. \qquad \text{Eq. 9}$$

The ratio of the feedback impedance to the input impedance is chosen so that the condition $$\frac{Z_f}{Z_i} \gg 1$$

is met. Then the amplifier output voltage 505 is approximated by $$v_c = -\frac{Z_f}{Z_i}(v - \dot{y}). \qquad \text{Eq. 10}$$

Inverting block 516 inverts $v_c$ to form control signal 506 given by:

$$d = -v_c = \frac{Z_f}{Z_i}(v - \dot{y}). \qquad \text{Eq. 11}$$

Generally, the output voltage y of any of the voltage converters is characterized by a time derivative $\dot{y}$ which according to Eq. 1, Eq. 3 and Eq. 6 has the form:

$$\dot{y} = Py + Sx_1 + Uu_0 + Vd. \qquad \text{Eq. 12}$$

Uppercase letters U and V should not be confused with lowercase letters u and v used elsewhere. From Eq. 12, the required duty ratio $d_r$, then takes the form:

$$d_r = \frac{-Py - Sx_1 - Uu_0 - k(y - y_0)}{V}. \qquad \text{Eq. 13}$$

For the analog controller 500, the switch and voltage converter plant produces output voltage 507 with time derivative $$\dot{y} = Py + Sx_1 + Uu_0 + Vd \qquad \text{Eq. 14}$$

where d is the control signal 506 given by Eq. 11. Substituting $\dot{y}$ from Eq. 14 into Eq. 11, and solving for d, the following result is obtained:

$$d = \frac{-Py - Sx_1 - Uu_0 + v}{\frac{Z_i}{Z_f} + V}. \qquad \text{Eq. 15}$$

Since $Z_i \ll Z_f$ and $v=-k(y-y_0)$ the control signal d for analog controller 500 approximates the required duty cycle $d_r$, thereby meeting all of the conditions for Input-Output Linearization.

Figure 5B:
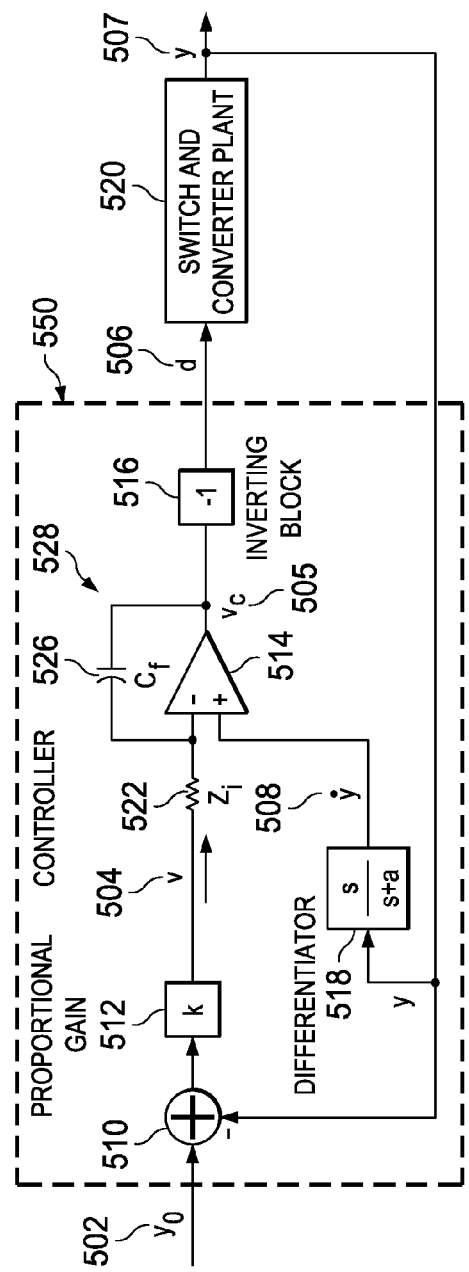
FIG. 5B is a circuit diagram of a preferred embodiment of an analog controller for a constant voltage converter plant implementing control under input-output linearization.

Referring to FIG. 5B in another embodiment, producing the same results, feedback impedance 524 ($Z_f$) is replaced by a feedback capacitance 526 ($C_f$) to form integrator 528 for analog controller 550. The remainder of analog controller 550 is the same as analog controller 500.

The gain of the integrator 528 is given by $$K_i = \frac{1}{Z_i C_f}.$$

The output voltage 505 of integrator 528 is given by $$v_c = -\frac{K_i}{s}v + \left(1 + \frac{K_i}{s}\right)\dot{y} \qquad \text{Eq. 16}$$

Considering non-idealities of differentiator 518 such as the differentiating gain $K_d$ and pole at s=−a, Eq. 16 is transformed and is given by $$v_c = -\frac{K_i}{s}v + \left(1 + \frac{K_i}{s}\right)\left(\frac{K_d s}{s+a}\right)y \qquad \text{Eq. 17}$$

The small signal transfer function from v (504) to d (506) is given by $$\frac{d}{v} = \frac{K_i(s+a)}{s(s(1+K_d G) + K_d K_i G + a)} \qquad \text{Eq. 18}$$

For frequencies s<<a, Eq. 18 is given by $$\frac{d}{v} = \frac{a}{K_d}\frac{1}{sG} \qquad \text{Eq. 19}$$

Here, G is the transfer function from the control 'd' to output 'y' of switch and converter plant 520.

Analog controller with input-output linearization is a "universal controller" that uses only output voltage sensing. No sensing of the internal component values, the input voltage or the inductor current is required by the analog controller. None of the parameters for the circuits in FIGS. 2, 3 and 4 are explicitly used in the generation of d.

Even though the inductor current $x_1$ is not explicitly sampled by the analog controller, the information related to $x_1$ is present in the output voltage y (in the form of output voltage ripple) and in ẏ. Hence, the analog control under input-output linearization shown in FIGS. 5A and 5B lead to the same equation as derived from traditional input-output linearization methods (equations 2, 5 and 8). Also, no sensing of the internal values of the power converter stage (L, C, $R_c$, $R_s$, R, $u_0$) is required anywhere since these values are inherently present in the sensed output voltage y and ẏ in the form of P, S, U and V of Eq. 14.

In another embodiment, the duty ratio d is approximately implemented in a digital controller using difference equations. A direct conversion of Eq. 11 gives:

$$d[n] = \frac{Z_f}{Z_i}\left[-k(y[n]-y_0) - \frac{y[n]-y[n-1]}{\Delta T}\right] \qquad \text{Eq. 20}$$

where ΔT is the time interval between two samples of the output voltage y. Values of $Z_f/Z_i$, k and ΔT are adjusted while in closed loop to obtain the correct value of duty cycle.

Eq. 20 is implemented using integrator 528 with $\Delta T_i$ integrator delay, Eq. 20 gives $$d[n] = d[n-1] + \Delta T_i\left[v[n] - \frac{K_d(y[n]-y[n-1])}{\Delta T}\right] \qquad \text{Eq. 21}$$

In another embodiment, the analog controller is configured for handling time-varying inputs and outputs. For a general time-varying target output voltage $y_0(t)$, the difference voltage v is given by $$v = \dot{y}_0(t) - k[y(t) - y_0(t)]. \qquad \text{Eq. 22}$$

Figure 6A:
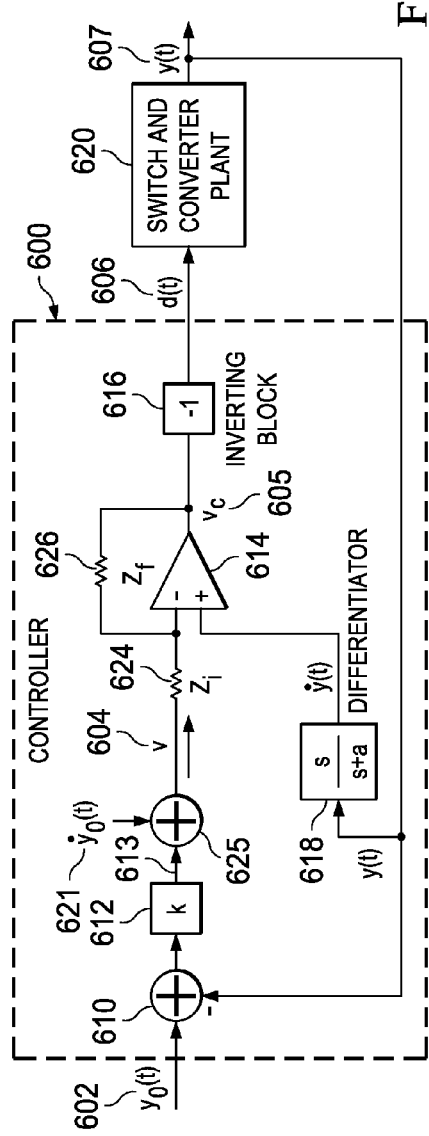
FIG. 6A is a circuit diagram of a preferred embodiment of an analog controller for a variable voltage converter plant implementing control under input-output linearization.
Figure 6B:
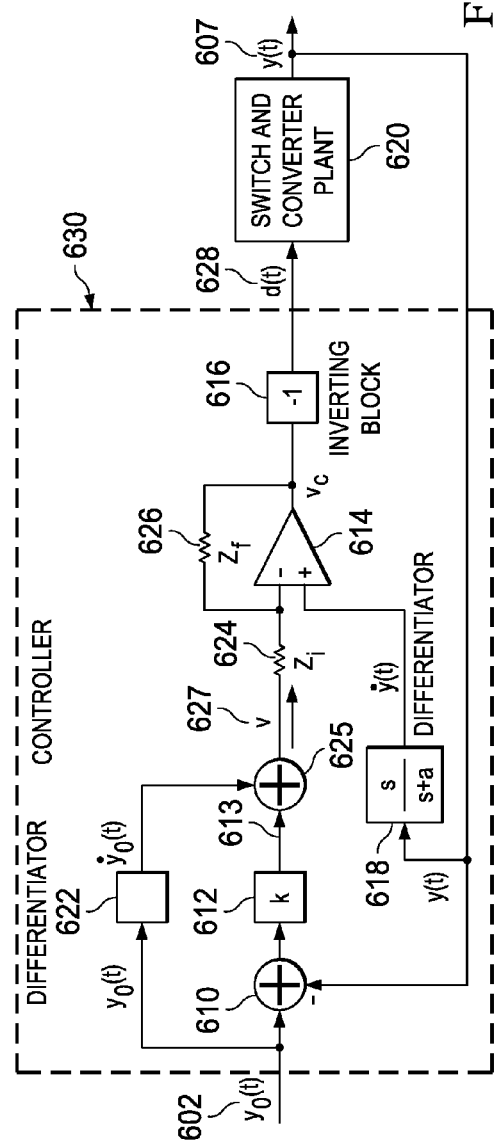
FIG. 6B is a circuit diagram of an alternate embodiment of an analog controller for a variable voltage converter plant implementing control under input-output linearization.

To implement Eq. 22, an analog controller as described in FIG. 6A or as described in FIG. 6B is used. If $y_0(t)$ is a known function of time, and $\dot{y}_0(t)$ is also a known function derived from $y_0(t)$, where both functions are bounded on [0, ∞), then the analog controller of FIG. 6A is suitable. If $y_0(t)$ is an arbitrary voltage input with a bounded time differential, then the analog controller of FIG. 6B is suitable.

Referring to FIG. 6A, circuitry for an analog controller 600 is described which controls a voltage converter based on known function of time, $y_0(t)$, which is provided as an input voltage 602. The time derivative $\dot{y}_0(t)$ is also known and provided as a time derivative input voltage 621. Analog controller 600 generates a time-varying control signal 606 d(t), produced under input-output linearization conditions with off-time switching, which is used by switch driver and converter plant 620 to further produce a time-varying output voltage 607. Output voltage 607 asymptotically approaches target output voltage 602.

Analog controller 600 includes summing block 610 connected to a proportional gain block 612 which is further connected to a summing block 625. Summing block 625 is connected to an inverting operational amplifier 614 through input impedance 624 ($Z_i$) to its negative input in an inverting configuration. The inverting operational amplifier 614 is operating in negative feedback with feedback impedance 626 ($Z_f$). In other embodiments, proportional gain block 612 is replaced by an integral gain block, or a PI (proportional-integral) gain block or a PID (proportional-integral-derivative) gain block.

Summing block 610 is configured to generate a difference between the time-varying output voltage 607 and the target output voltage 602. Proportional gain block 612, applies proportional gain k to the difference, producing an intermediate voltage 613 given by $-k(y(t)-y_0(t))$ where y(t) is output voltage 607 and $y_0(t)$ is target output voltage 602. Summing block 625 sums the time derivative input voltage 621 and the intermediate voltage 613 to produce voltage 604 given by Eq. 22.

Inverting operational amplifier 614 produces amplifier voltage 605 and is further connected to an inverting block 616 which produces a control signal 606 fed into switch driver and converter plant 620 to control switching of an internal voltage converter. The positive input of inverting operational amplifier 614 is connected to the output of a differentiator 618 which differentiates output voltage 607 to produce ẏ(t). The differentiator 618 incorporates a capacitance that adds a pole to the differentiator transfer function at s=−a where s is the complex variable in the Laplace transform domain.

Summing block 610, summing block 625, differentiator 618, and inverter block 616 are implemented using operational amplifiers as known in the art.

In another embodiment, producing the same result, the inverting block 616 is removed and the connections to the positive and negative inputs of the inverting operational amplifier 614 are reversed.

The other principles of operation for analog controller 600 are as described for analog controllers 500 and 550 of FIGS. 5A and 5B and not repeated here.

Referring to FIG. 6B, analog controller 630 is described for the situation where the input voltage 602, given by $y_0(t)$, is an arbitrary function. A differentiator 622 is provided having input $y_0(t)$ and output $\dot{y}_0(t)$. Summing block 625 sums the output $\dot{y}_0(t)$ from differentiator 622 together with intermediate voltage 613 generated by proportional gain block 612. The output 627 of the summing block 625 provides the input voltage signal v to inverting operational amplifier 614 according to Eq. 22.

Analog controller 630 generates a time-varying control signal 628 d(t), produced under input-output linearization conditions with off-time switching, which is used by switch driver and converter plant 620 to further produce a time-varying output voltage 607. Output voltage 607 asymptotically approaches input voltage 602.

The other components and principles of operation for analog controller 630 are as described for analog controller 600 of FIG. 6A and for analog controllers 500 and 550 of FIGS. 5A and 5B, respectively, and not repeated here.

In other embodiments, analog controllers 500, 550, 600, and 630 are applied to other power converters besides those disclosed in FIGS. 2-4 including a Flyback converter and other known converter topologies. The condition for input-output linearization to satisfy the Ridley condition (e.g. Eq.7) for topologies with a right half plane zero remains the same for control with analog controllers 500 and 550.

Figure 7:
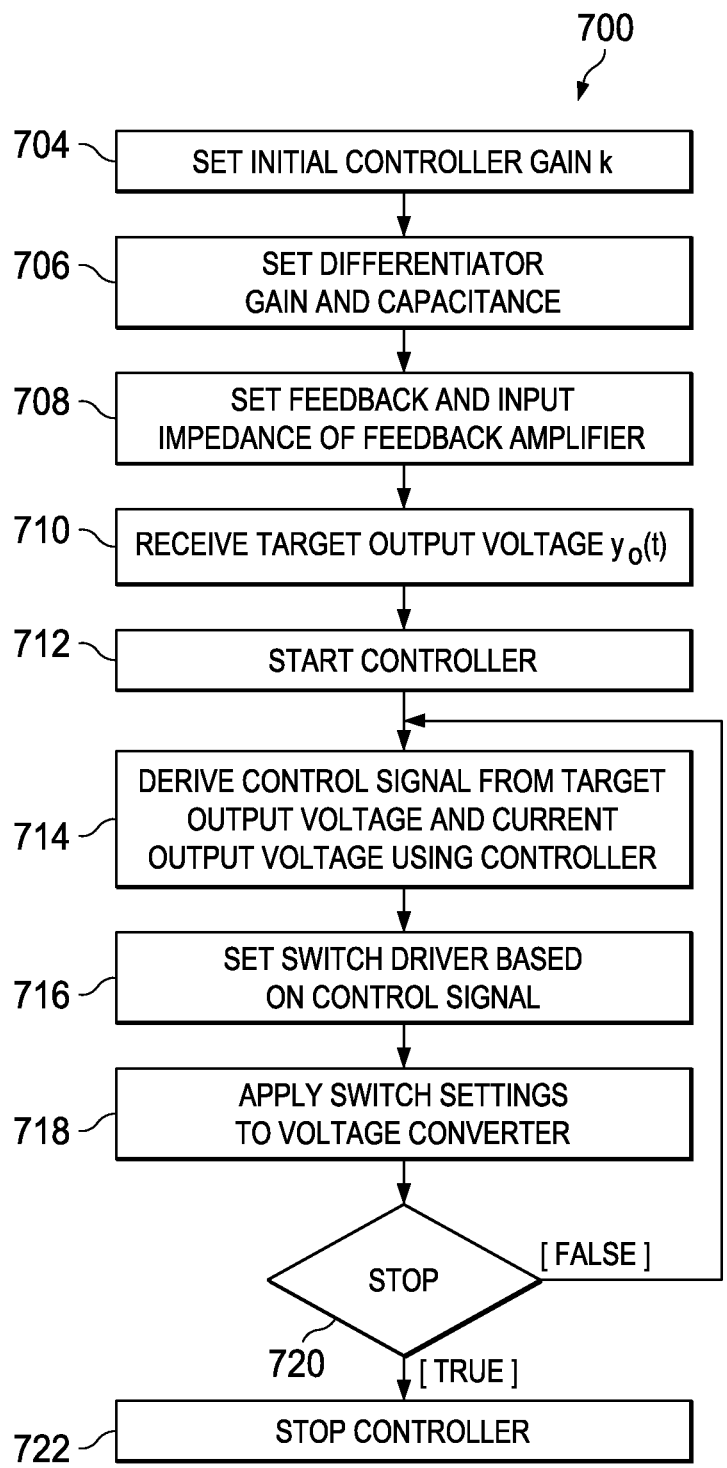
FIG. 7 is a flow diagram for a preferred method of operation of a voltage converter with analog input-output linearization.

Referring to FIG. 7, a method 700 is described for operation of a voltage converter producing an output voltage using analog control under input-output linearization. The voltage converter includes a voltage converter circuit, a controller, a switch driver, a voltage source supplying input voltage and a voltage reference supplying a target output voltage where the target output voltage is constant or time-varying.

The method begins at step 704 where an initial controller gain k is set to a pre-defined (proportional, integral and derivative) gain value. At step 706, a gain and capacitance is set for a differentiator that differentiates the output voltage of the voltage converter. At step 708, the feedback gain of a feedback operational amplifier is set by fixing an input impedance and a feedback impedance. At step 710, the target output voltage is received by the controller.

At step 712, the controller is started which causes the controller, switch driver, and voltage converter circuit to continuously perform the steps 714, 716 and 718. At step 714, an analog control signal is produced by the controller, the analog control signal representing duty ratio d(t) as determined by input-output linearization. At step 716, the switch driver changes switch states based on the analog control signal. At step 718, the switch states are applied to the switches of the voltage converter circuit which results in the voltage converter circuit producing the output voltage.

At step 720, a determination of a stop condition is made. If the stop condition is true, then at step 722, the voltage converter is stopped. If the stop condition is false, then the method continues performing steps 714, 716, 718 and 720. As the steps 714, 716 and 718 are continuously performed, the output voltage asymptotically approaches the target output voltage.

An analog input-output linearization is applied to control multi-input, multi-output n dimensional state space systems with vector relative degree. A digital controller with input-output linearization can be developed for a single inductor, single input voltage, and multiple output system, for example, as disclosed in U.S. patent application Ser. No. 13/373,673 ('673 patent application). However, the digital controller in the '673 patent application relies on detailed knowledge of all circuit parameters of every output converter stage in the multiple output system.

An analog input-output linearization control for a multiple output converter including a set of output converter stages is implemented, that does not depend upon the detailed circuit parameters for a set of converter stages. The analog input-output linearization control is based on combining a set of analog controllers to control the set of output converter stages, where each analog controller is similar to analog controllers 500 and 550. Additionally, the set of analog controllers are coupled to an n×n gain block. The control signal is a vector which takes the form d=A(K(y−y$_o$)−α), as derived in the '673 patent application, where K is a gain matrix, implemented by the n×n gain block, which includes off-diagonal error terms coupling the output voltages y$_i$ and target output voltages y$_{io}$ into control signals d$_i$ for i=1, 2, ... n. The matrix A and vector α are derived, as in the '673 patent application, to implement input-output linearization based on circuit parameters of the set of output stages constrained to satisfy a generalized Ridley condition.

The embodiments presented in this disclosure are intended to provide implementable examples of the present invention, but are not intended to limit the present invention. For example, analog methods of deltaE as disclosed in the '850 patent application are used in conjunction with the analog controller to obtain a complete analog solution for performing input-output linearization. Embodiments of systems using analog input-output linearization are developed for single input, single output n dimensional state space systems. Examples are the Cuk converter and the Sepic converter, both having dimension n=4.

It will be appreciated by those skilled in the art that modifications can be made to the embodiments disclosed and remain within the inventive concept. Therefore, this invention is not limited to the specific embodiments disclosed, but is intended to cover changes within the scope and spirit of the claims.

The invention claimed is:

1. A voltage converter for converting an input voltage to an output voltage comprising:
a voltage converter circuit comprising a set of switches;
a switch driver connected to the voltage converter circuit;
a controller connected to the switch driver and the output voltage;
a target output voltage connected to the controller;
a control signal generated by the controller for the switch driver, comprising a duty ratio based on the target output voltage and the output voltage;
the switch driver configured to apply the control signal to the set of switches;
whereby the voltage converter circuit generates the output voltage based on the duty ratio to match the target output voltage;
the duty ratio given by:

$$d = \frac{z_f}{z_i}(v - \dot{y});$$

wherein $\dot{y}$ is the differentiated output voltage, v is the voltage signal, $Z_f$ is the feedback impedance, and $Z_i$ is the input impedance.

2. The voltage converter of claim 1, wherein the controller is configured to generate the control signal based on input-output feedback linearization of a set of state variables with stable zero dynamics.

3. The voltage converter of claim 2, wherein the voltage converter circuit comprises a buck converter circuit.

4. The voltage converter of claim 2, wherein the voltage converter circuit comprises a boost converter circuit.

5. The voltage converter of claim 2, wherein the voltage converter circuit comprises a buck-boost converter circuit.

6. The voltage converter of claim 2, wherein the controller further comprises:
a summing block connected to the target output voltage and the output voltage;
a difference between the output voltage and the target output voltage, generated by the summing block;

a proportional gain block connected to the summing block, configured to produce a voltage signal from the difference;
an input impedance connected to the proportional gain block;
an operational amplifier connected to the input impedance;
a feedback impedance connected in parallel with the operational amplifier;
an inverting block connected to the operational amplifier;
a differentiator connected to the operational amplifier and the output voltage, configured to generate a differentiated output voltage from the output voltage;
the duty ratio formed by the inverting block.

7. The voltage converter of claim 2, wherein the input voltage is a fixed input voltage.

8. The voltage converter of claim 2, wherein the input voltage is a time-varying input voltage.

9. The voltage converter of claim 2, wherein the target output voltage is a fixed target output voltage and wherein the output voltage is a fixed target output voltage.

10. The voltage converter of claim 2, wherein the target output voltage is a time-varying target output voltage and wherein the output voltage is a time-varying output voltage.

11. A voltage converter for converting an input voltage to an output voltage comprising:
a voltage converter circuit comprising a set of switches;
a switch driver connected to the voltage converter circuit;
a controller connected to the switch driver and the output voltage;
a target output voltage connected to the controller;
a control signal generated by the controller for the switch driver, comprising a duty ratio based on the target output voltage and the output voltage;
the switch driver configured to apply the control signal to the set of switches;
whereby the voltage converter circuit generates the output voltage based on the duty ratio to match the target output voltage;
the duty ratio given by:

$$d[n] = d[n-1] + \Delta T_i \left[ v[n] - \frac{K_d(y[n] - y[n-1])}{\Delta T} \right];$$

wherein $\Delta T$ is a time interval between two samples of the output voltage y[n] and y[n−1], v[n] is a voltage signal, $K_d$ is a differentiating gain, $\Delta T_i$ is an integrator delay, and d[n−1] is a previous duty cycle.

12. The voltage converter of claim 11, wherein the controller further comprises:
a summing block connected to the target output voltage and the output voltage;
a difference between the output voltage and the target output voltage, generated by the summing block;
a proportional gain block connected to the summing block, configured to produce a voltage signal from the difference;
an input impedance connected to the proportional gain block;
an operational amplifier connected to the input impedance;
a feedback capacitance connected in parallel with the operational amplifier to form an integrator;
an inverting block connected to the operational amplifier;
a differentiator connected to the operational amplifier and the output voltage, configured to generate a differentiated output voltage from the output voltage;
the duty ratio formed by the inverting block.

13. A voltage converter for converting an input voltage to an output voltage comprising:
a voltage converter circuit comprising a set of switches;
a switch driver connected to the voltage converter circuit;
a controller connected to the switch driver and the output voltage;
a target output voltage connected to the controller;
a control signal generated by the controller for the switch driver, comprising a duty ratio based on the target output voltage and the output voltage;
the switch driver configured to apply the control signal to the set of switches;
whereby the voltage converter circuit generates the output voltage based on the duty ratio to match the target output voltage;
wherein the target output voltage is a time-varying target output voltage and wherein the output voltage is a time-varying output voltage;
wherein the duty ratio is a time-varying control signal given by:

$$d(t) = \frac{z_f}{z_i}(v - y(t));$$

wherein $\dot{y}(t)$ is a differentiated time-varying output voltage generated from the time-varying output voltage, $Z_f$ is the feedback impedance, and $Z_i$ is the input impedance;
wherein v is a voltage signal given by:
$v = \dot{y}_0(t) - k[y(t) - y_0(t)]$;
wherein $\dot{y}_0(t)$ is a differentiated time-varying target output voltage, k is a proportional gain, y(t) is the time-varying output voltage, and $y_0(t)$ is the time-varying target output voltage.

14. The voltage converter of claim 13, wherein the controller further comprises:
a first summing block connected to the time-varying target output voltage and the time-varying output voltage;
a difference between the time-varying output voltage and the time-varying target output voltage, generated by the first summing block;
a proportional gain block connected to the first summing block;
an intermediate voltage produced by the proportional gain block from the difference and a proportional gain;
a second summing block connected to the proportional gain block;
a time derivative input voltage connected to the second summing block;
a voltage signal produced by the second summing block from the intermediate voltage and the time derivative input voltage;
an input impedance connected to the second summing block;
an operational amplifier connected to the input impedance;
a feedback impedance connected in parallel with the operational amplifier;
an inverting block connected to the operational amplifier;
a differentiator connected to the operational amplifier and the time-varying output voltage, configured to generate a differentiated time-varying output voltage from the time-varying output voltage;
wherein the duty ratio is a time-varying control signal formed by the inverting block.

15. The voltage converter of claim 14, wherein the time-varying target output voltage is a known function of time.

16. The voltage converter of claim 14, wherein the differentiator is a second differentiator and the controller further comprises:
a first differentiator connected to the time-varying target output voltage and the second summing block;
the time derivative input voltage generated by the first differentiator.

17. The voltage converter of claim 16, wherein the time-varying input voltage is an arbitrary voltage input.

18. In a voltage converter comprising a voltage converter circuit comprising a set of switches, a switch driver connected to the voltage converter circuit, and a controller connected to the switch driver, a method for converting an input voltage to an output voltage comprising the steps of:
receiving a target output voltage;
receiving the input voltage;
generating a feedback output voltage;
sensing the feedback output voltage;
generating a control signal from the target output voltage and the feedback output voltage;
changing a set of switch states of the set of switches based on the control signal;
applying the set of switch states to the set of switches to generate the output voltage;
wherein the step of generating a control signal further comprises the step of calculating a duty ratio;
wherein the step of calculating a duty ratio further comprises the steps of:
implementing input-output linearization;
sampling a set of feedback output voltages;
calculating a time interval between each of the set of feedback output voltages; and,
adjusting the duty ratio with an integrator delay and the time interval.

19. The method of claim 18, further comprising the steps of:
setting an initial gain for the controller;
setting a gain and a capacitance for the controller; and,
determining an input impedance and a feedback impedance for the controller.

20. The method of claim 18, wherein the target output voltage is a time-varying target output voltage and the feedback output voltage is a time-varying feedback output voltage, and wherein the step of generating a control signal further comprises the steps of:
differentiating the time-varying target output voltage to create a differentiated time-varying target output voltage; and,
calculating the duty ratio from the differentiated time-varying target output voltage and the time-varying feedback output voltage.

21. The method of claim 18, wherein the time-varying target output voltage is a known function of time, and wherein the step of calculating further comprises the step of calculating a time-varying duty ratio from the known function of time and the time-varying feedback output voltage.

22. The method of claim 18, wherein the time-varying target output voltage is an arbitrary voltage, and wherein the step of calculating further comprises the step of calculating a time-varying duty ratio from the arbitrary voltage and the time-varying feedback output voltage.

* * * * *